United States Patent [19]

Kawabe

[11] Patent Number: 5,609,497
[45] Date of Patent: Mar. 11, 1997

[54] IC SOCKET

[75] Inventor: Eiji Kawabe, Machida, Japan

[73] Assignee: I-PEX Co., Ltd., Tokyo, Japan

[21] Appl. No.: 452,827

[22] Filed: May 30, 1995

[30] Foreign Application Priority Data

Jun. 14, 1994 [JP] Japan ................................. 6-132055

[51] Int. Cl.⁶ ................................................. H01R 13/62
[52] U.S. Cl. ............................................ 439/331; 439/526
[58] Field of Search ............................... 439/70, 71, 72, 439/73, 330, 331, 264, 525, 526

[56] References Cited

U.S. PATENT DOCUMENTS

| | | | |
|---|---|---|---|
| 4,758,176 | 7/1988 | Abe et al. .................... | 439/331 |
| 4,840,576 | 6/1989 | Nierescher et al. ................ | 439/331 |
| 5,100,332 | 3/1992 | Egawa .......................... | 439/331 |
| 5,244,404 | 9/1993 | Kishi et al. ..................... | 439/331 |
| 5,460,538 | 10/1995 | Ikeya ........................... | 439/331 |

*Primary Examiner*—Hien Vu
*Attorney, Agent, or Firm*—Varndell Legal Group

[57] ABSTRACT

A guide component, which supports a pressing member such that it can slide up and down at a specific location over an IC, is provided to the inner side of a cover lid 20, and a pressing component is formed on the pressing member 24 side of the cover lid, so that when the socket substrate is closed by the cover lid, the pressing member is supported in a state in which it can only slide up and down at a specific location over the IC, and the pressing member is pressed perpendicularly while the pressing component slides over the back surface of the pressing member.

13 Claims, 7 Drawing Sheets

IC SOCKET

BACKGROUND OF THE INVENTION

1. Field of the Invention

The present invention relates to an IC socket with which electrical connection between the contact terminal of a socket substrate and the electrode of an integrated circuit device (IC) is achieved by positioning the IC on the socket substrate and then closing a cover lid.

2. Description of the Related Art

FIG. 11 is a schematic cross section of the structure of a typical conventional IC socket. With this IC socket, a concave portion 3 that houses an IC 2 is formed in the center of a socket substrate 1. Contacts (contact terminals) 5 that are in contact with IC leads (electrodes) 4 for the IC 2 housed in this concave portion 3 are positioned in a row at a specific interval on the bottom of the concave portion 3. The contacts 5 are formed with a roughly U-shaped cross section such that they will have an upward resilience.

A cover lid 6 is rotatably attached to the socket substrate 1 via a hinge 7, and the cover lid 6 is energized in the direction of the arrow a by a coil spring (not shown). To the other end of the cover lid 6 is attached a stop lever 9 that has a hook-shaped leading edge 8, and the stop lever 9 is energized in the direction of the arrow B by a coil spring (not shown). A pressing component 10 that presses against the IC lead 4 from above is rotatably supported on the back side of the cover lid 6 with a shaft 11 as its fulcrum.

A step 12 is formed on the other end of the socket substrate 1 at a location corresponding to the leading edge 8 of the stop lever 9. When the IC 2 is housed in the concave portion 3 of the socket substrate 1, the contacts 5 of the socket substrate 1 and the IC lead 4 of the IC 2 are brought together, and the cover lid 6 is closed, then the leading edge 8 of the stop lever 9 engages with the step 12 of the concave portion 3 so that the socket substrate 1 is fixed to the cover lid 6. At this point, the IC lead 4 resists the resilience of the contacts 5 and presses against the contacts 5 through this pressing force by means of cover ends 10a formed on the lower end of the pressing member 10, thus ensuring good conduction between the IC lead 4 and the contacts 5.

With the conventional IC socket described above, a row of IC leads 4 can be pressed substantially simultaneously with a substantially perpendicular pressing force by means of the pressing member 10, so there is no distortion of the IC leads 4 caused by unbalanced load when the cover lid 6 is closed. However, with an IC socket structured as above, since the movement of the pressing member 10 is limited solely to rotation around the shaft 11, the pressing member 10 undergoes a positional shift in the lateral direction when the cover lid 6 is closed centering around the hinge 7. This is explained graphically in FIG. 12.

FIG. 12 is a diagram of the locus of the shaft 11 when the cover lid 6 is closed. In FIG. 11, if we assume that the shaft 11 is in the position a shown in FIG. 12 when the covering end 10a of the pressing member 10 comes into contact with the IC leads 4, then the shaft 11 moves from position a to position a', which means that the position of the shaft 11 has shifted by At when viewed from above.

Specifically, since lateral shifting occurs with a conventional IC socket when the pressing member 10 presses against the IC leads 4, there is a positional shift between the IC leads 4 and the corresponding contacts 5, and this is a problem in that poor conduction between the leads of the IC and the contacts of the socket results, making impossible the normal operation of the IC.

Even with a leadless IC where signal pads as electrodes are provided, lateral shifting of the IC itself occurs just as with the lead-attached IC discussed above, so there is a positional shift between the contacts and the signal pads installed on the back, and this can lead to poor conduction therebetween.

SUMMARY OF THE INVENTION

An object of the present invention is to provide an IC socket with which the lateral shifting of the IC that occurs during the housing of an IC into the IC socket is prevented and with which proper conduction between the electrodes of the IC and the contacts of the IC socket can be obtained.

In order to achieve the stated object, the IC socket of the present invention is designed such that an IC on which electrodes have been installed is housed on a socket substrate, and the IC is pressed by a pressing member provided to a cover lid when the socket substrate is closed by the cover lid, and conduction is obtained between the electrodes and the contact terminals of the socket substrate, wherein the IC socket is provided with a guide component that holds the pressing member at a specific location over the IC such that it can slide up and down, and with a pressing component that presses in a perpendicular direction against both the IC and the pressing member held by the guide component.

With the IC socket described above, when the cover lid is closed in a state in which the IC is housed on the socket substrate, the pressing member is set in the specific position on the IC by the guide component and is held in a state in which it can only move up and down. When the cover lid is further closed in this state, the pressing member held by the guide component is pressed to the IC side along with the pressing component, and since at this point the movement of the pressing member in the lateral direction is restricted by the guide component, the pressing member presses the IC perpendicularly from directly above, so there is no lateral shifting of the IC itself when the IC is pressed.

Other objects and merits of the present invention will be readily apparent from the following detailed description and appended figures.

DESCRIPTION OF THE PREFERRED EMBODIMENTS

Embodiments of the IC socket according to the present invention will now be described while referring to the accompanying drawings.

Figure 1:
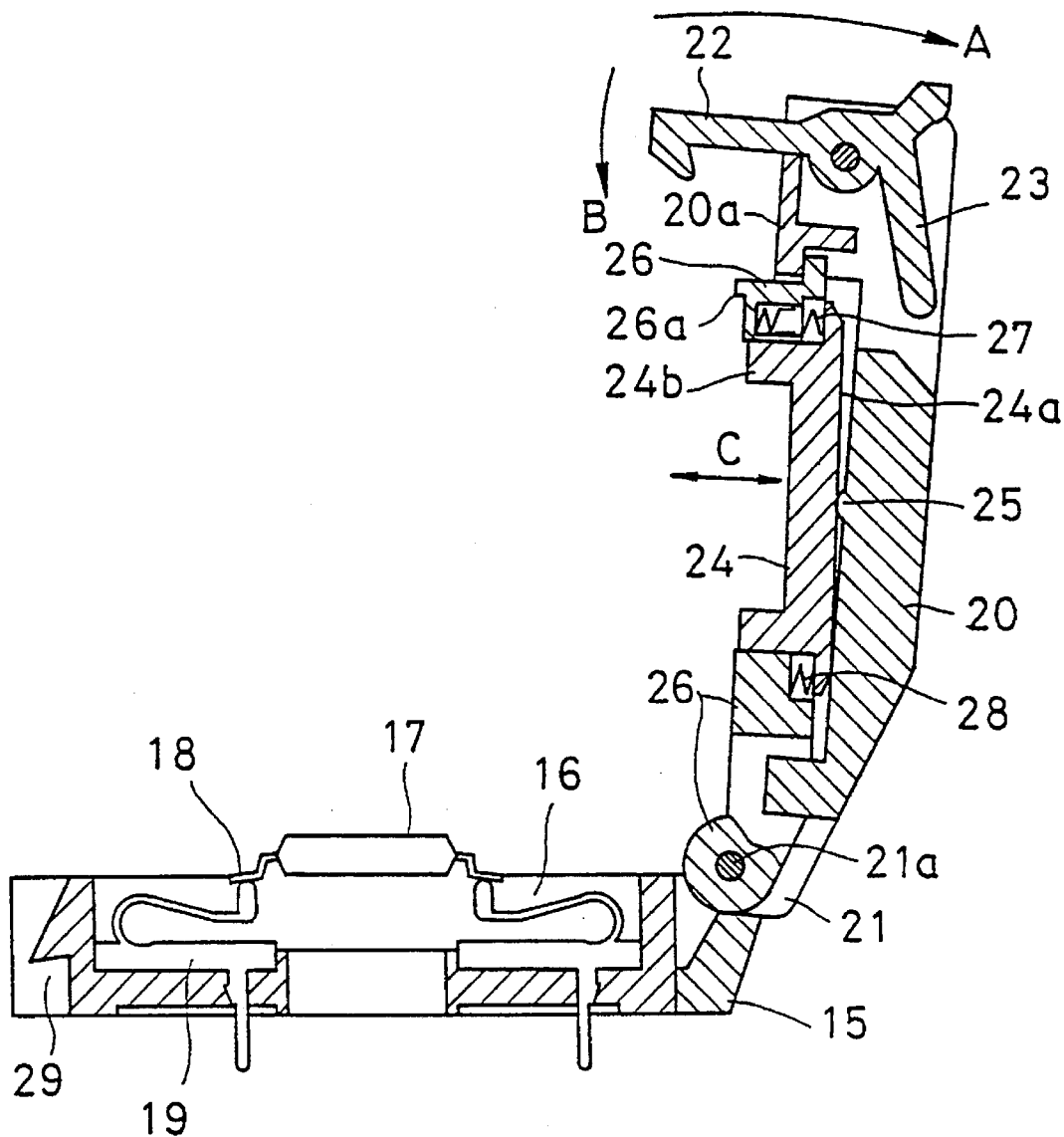
FIG. 1 is a schematic cross-sectional view illustrating one embodiment of an IC socket for a lead-attached IC with its cover lid being in an open state.

Referring to FIG. 1, a concave portion 16 is formed in the center of a socket substrate 15, and contacts 19 that are in contact with the IC leads 18 of the IC 17 are arranged in a row at a specific interval on the bottom of this concave portion 16. A cover lid 20 is rotatably attached to the socket substrate 15 by the shaft 21a of a hinge 21, and is energized in the direction of the arrow A by a coil spring (not shown). The cover lid 20 is open to the fullest degree in the state in FIG. 1. A stop lever 23 that has a hook-shaped leading edge 22 is attached to the other end of the cover lid 20, and the stop lever 23 is energized in the direction of the arrow B by a coil spring (not shown).

The inner side of the cover lid 20 is provided with a pressing member 24 that presses against the IC leads 18, and with a guide component 26 that holds this pressing member 24 in a specific position over the IC such that the pressing member 24 can slide up and down. This guide component 26 is formed in the form of a frame, one end of which is rotatably held concentrically with the cover lid 20 by the shaft 21a of the hinge 21, and the other end of which engages with a stop member or component 20a of the cover lid 20. This pressing member 24 is energized to the cover lid 20 side by springs 27 and 28, and is held within the guide component 26 such that it can slide in the direction of the arrow C.

Meanwhile, a pressing component 25 that presses against the pressing member 24 is formed on the side of the cover lid 20 closest to the pressing member 24. The pressing component 25 in this embodiment consists of a hemispherical protrusion so that the contact area with the pressing member 24 will be small.

The pressing member 24 held by the guide component 26 in the state in FIG. 1 is pressed to the cover lid 20 side by the resilience of the springs 27 and 28, and the pressing component 25 comes into contact at a point near the center of the back 24a of the pressing member 24. Meanwhile, a step 29 is formed on the other end of the socket substrate 15 at a position corresponding to the leading edge 22 of the stop lever 23, and is constructed such that it engages with the leading edge 22 of the stop lever 23 when the cover lid 20 is closed.

The IC 17 rests on a holding means (not shown) composed of a coil spring or the like positioned inside the socket substrate 15, and in the state in FIG. 1, the IC leads 18 and the contacts 19 are held across from each other with a small gap in between by this holding means. The holding means is constructed such that it energizes the IC 17 slightly in the upward direction and contracts downward under the pressing force of the pressing member 24.

Figure 2:
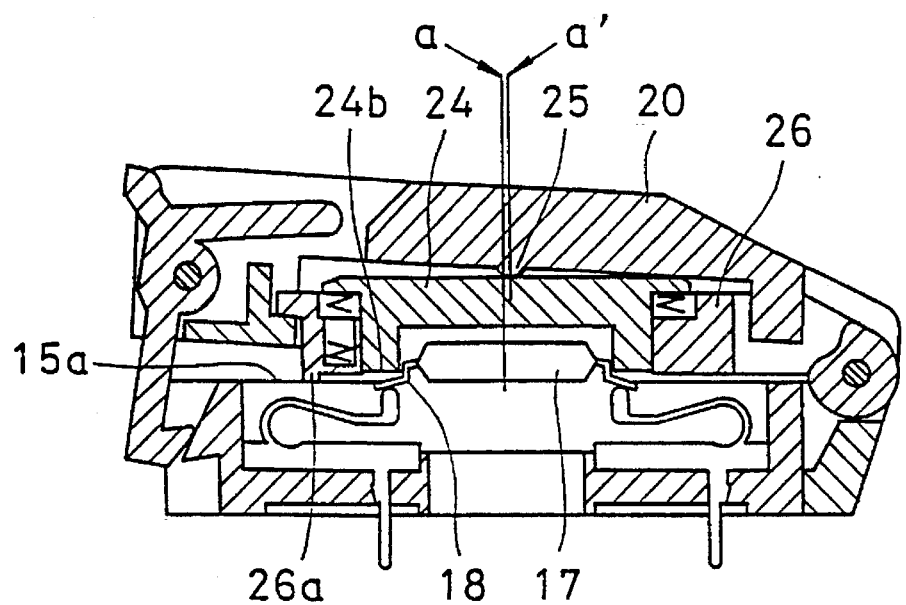
FIG. 2 is a schematic cross-sectional view illustrating the IC socket of FIG. 1 with its guide component being in contact with the socket substrate.

As the cover lid 20 is closed in the state in FIG. 1, the lower end 26a of the guide component 26 comes into contact with the upper surface 15a of the socket substrate 15, and the pressing member 24 is held in a specific position over the IC 17 such that the pressing member 24 can slide up and down, as shown in FIG. 2. In this state the covering end 24b of the pressing member 24 is not in contact with the IC leads 18, and the IC leads 18 of the IC 17 are not in contact with the contacts 19. FIG. 2 illustrates a stand-by state prior to the pressing of the IC leads, in which there are small gaps between the covering end 24b, the IC leads 18, and the contacts 19. The center of the pressing member 24 is in position a, and the center of the pressing component 25 of the cover lid 20 is in position a'. In the state in FIG. 2, there is a slight shift in the center positions of the two.

Figure 3:
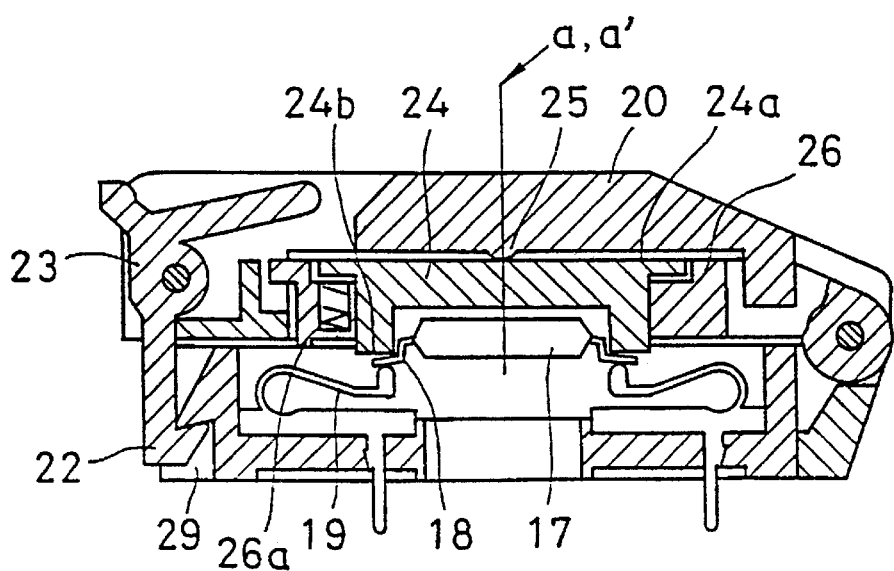
FIG. 3 is a schematic cross-sectional view of the IC socket of FIG. 1 with its cover lid closing off and fixing the socket substrate.

When the cover lid 20 is pressed in further, the leading edge 22 of the stop lever 23 engages with the step 29 of the socket substrate 15 and is fixed, as shown in FIG. 3. At this point, the pressing member 24 held by the guide component 26 presses perpendicularly on the IC leads 18 from directly above. Furthermore, the pressing component 25 of the cover lid 20 slides over the back 24a of the pressing member 24 by the amount of shift in a state of point contact, and the center thereof moves from position a' to position a and coincides in a planar fashion with the center of the pressing member 24 (a=a'). As a result, the IC leads 18 press against the resilience of the contacts 19 by means of the covering end 24b of the pressing member 4, and are thereby pressed against the contacts 19, which ensures good conduction.

Specifically, as the cover lid 20 is closed, the motion of the pressing member 24 in the horizontal direction is restricted by the guide component 26, and in this state the IC leads 18 are held in a position where they are pressed perpendicularly from directly above. When the cover lid 20 has been completely closed, the pressing component 25 slides by the amount of shift over the surface of the back 24a of the pressing member 24, so even if excessive force in the lateral direction, which would be a cause of lateral shifting with respect to the pressing member 24, is applied during the pressing of the pressing member 24, there is no shifting of the pressing member 24, and it is therefore possible to prevent the lateral shifting of the IC leads 18.

There is generally a slight gap in the fit between the pressing member 24 and the guide component 26 caused by dimensional machining errors, etc. Therefore, depending on the shape of the pressing component 25, it is possible that there will be lateral shifting of the IC leads 18 by the amount of the slight gap between the pressing member 24 and the guide component 26. However, if the pressing component is in the form of a protrusion with a small contact area, as in this embodiment, this lateral shifting of the IC leads can be minimized. Other embodiments of the pressing component 25 will now be described, and it is possible to minimize the lateral shifting of the IC leads in the structures involved in these embodiments as well.

Figure 4:
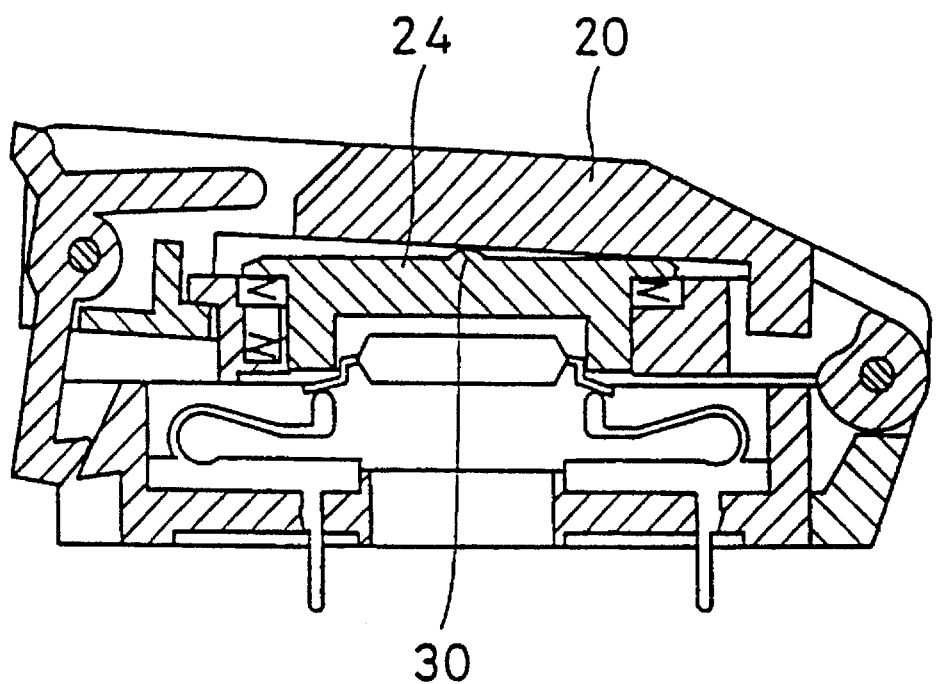
FIG. 4 is a schematic cross-sectional view illustrating another embodiment of an IC socket for a lead-attached IC.

In the above embodiment, the pressing component 25 was provided to the back side of the cover lid 20, and the IC leads 18 were pressed by point contact between the leading edge of this pressing component 25 and the pressing member 24, but another possible structure, as shown in FIG. 4, is for the pressing component 30 to be formed on the cover lid side of the pressing member 24, and for the IC leads 18 to be pressed by point contact between the leading edge of the pressing component 30 and the cover lid 20. In this example as well, when the cover lid 20 is closed, the pressing component 30 slides by the amount of shift over the back surface of the cover lid 20, so the lateral shifting of the pressing member 24 can be prevented.

Figure 5:
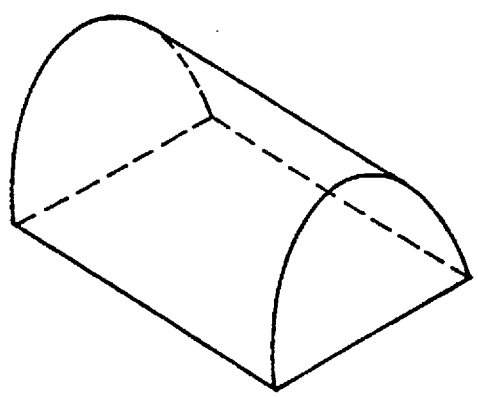
FIG. 5 is a schematic perspective view illustrating the structure of another example of a pressing component.

A semi-cylindrical pressing component may also be formed on the back side of the cover lid 20 and the IC leads pressed by line contact between the pressing component and the pressing member, as shown in FIG. 5, or the semi-cylindrical pressing component may be formed on the cover lid side of the pressing member 24 and the IC leads pressed by line contact between the pressing component and the pressing member.

Figure 6:
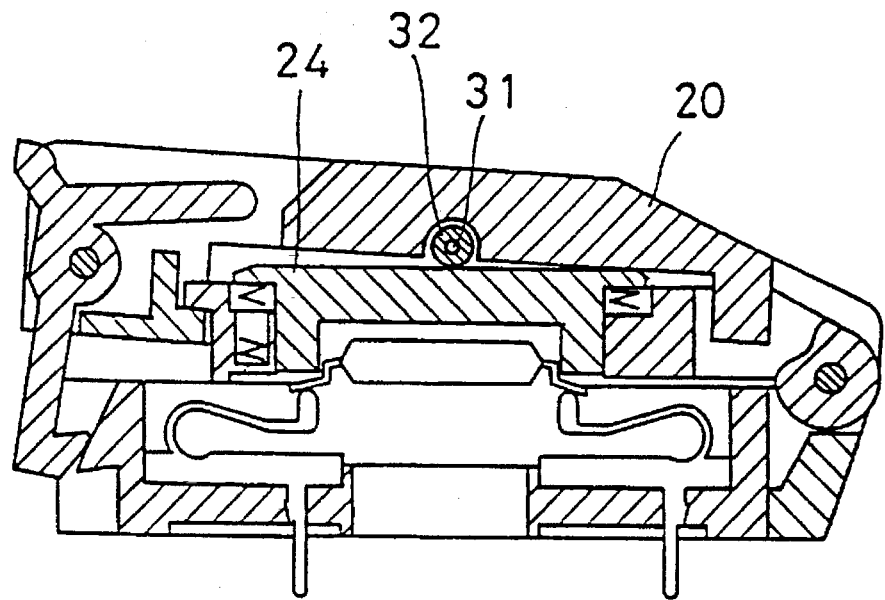
FIG. 6 is a schematic cross-sectional view illustrating still another embodiment of an IC socket for a lead-attached IC.

In another embodiment, as shown in FIG. 6, a roller 32 that is able to rotate in two directions can be attached near the center of the pressing member of the cover lid 20 with a shaft 31 as its fulcrum, and this roller used as the pressing component to press the IC leads 18 by line contact between the contact surface of the roller 32 and the pressing member 24. This roller 32 may also be provided near the center of the cover lid side of the pressing member 24 so that it presses against the IC leads 18 by line contact between the contact surface of the roller 32 and the cover lid 20.

Figure 7:
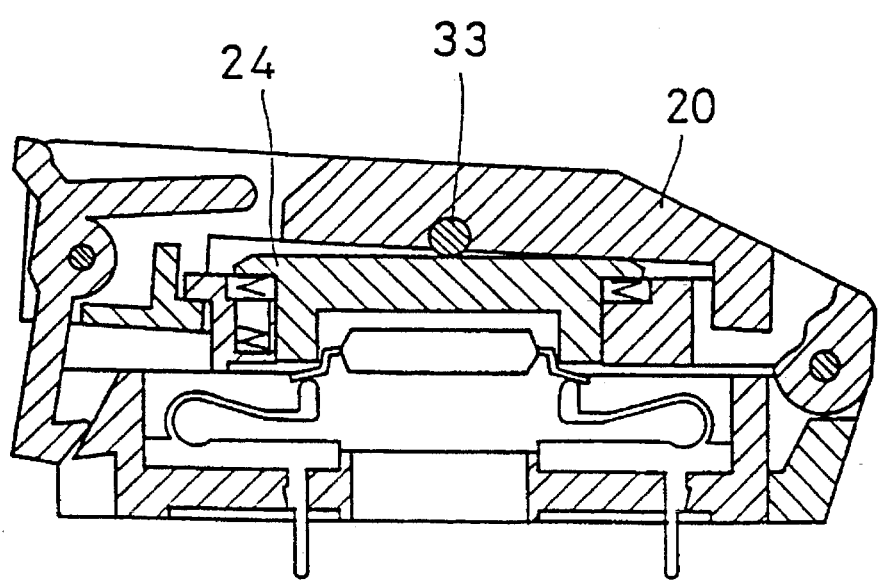
FIG. 7 is a schematic cross-sectional view illustrating yet another embodiment of an IC socket for a lead-attached IC.

In another embodiment, as shown in FIG. 7, a track ball 33 that is able to rotate in any direction may be embedded near the center of the pressing member side of the cover lid 20, and this track ball used as the pressing component to press the IC leads 18 by point contact between the contact surface of the track ball 33 and the pressing member 24. This track ball 33 may also be provided near the center of the cover lid side of the pressing member 24 so that it presses against the IC leads 18 by point contact between the contact surface of the track ball 33 and the cover lid 20.

Also, although not depicted in the figures, a pressing component that has a flat contact portion may be formed on the cover lid or the pressing member so that the IC leads will be pressed by the surface contact of the pressing component.

In each of the above embodiments, the pressing component is formed near the center of the cover lid 20 (or the pressing member 24) so that the pressing member 24 will apply pressure as uniformly as possible, but since the horizontal movement of the outer surface (sliding surface) of the pressing member 24 is restricted by the inner surface (guide surface) of the portion of the guide component 26 formed as a frame, the contact portion between the cover lid 20 and the pressing member 24 does not necessarily have to be near the center of the cover lid 20 (or the pressing member 24).

The embodiments described above dealt with an IC socket for a lead-attached IC, but the IC socket according to the present invention can also be applied to a leadless IC.

An embodiment will now be given for an IC socket for a leadless IC. The basic structure of the IC socket described in this embodiment is about the same as that of the IC socket shown in FIG. 1, so the description of the main components will be omitted here.

Figure 8:
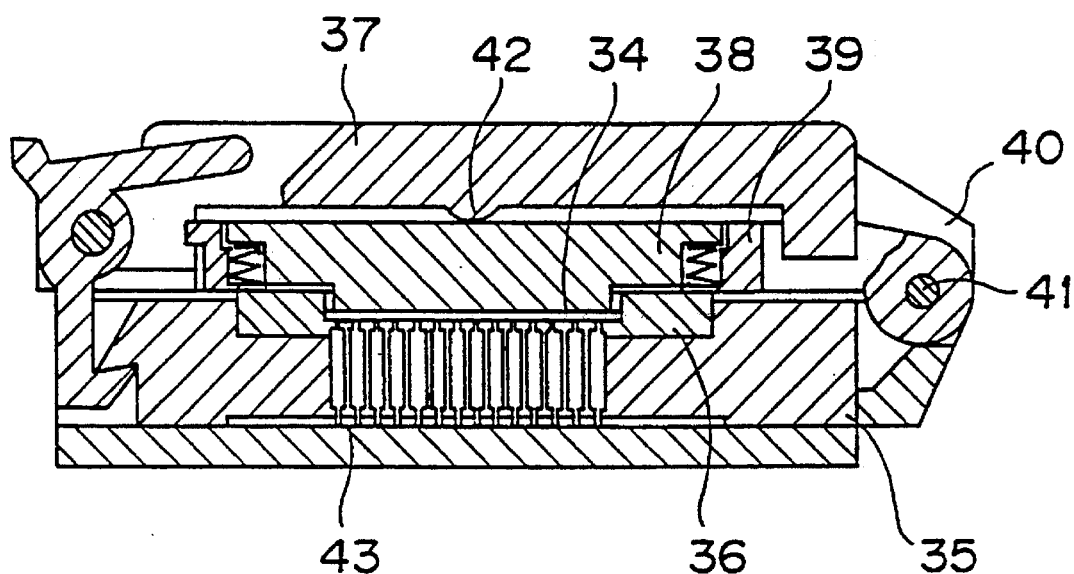
FIG. 8 is a schematic cross-sectional view illustrating an embodiment of an IC socket for a leadless IC.

FIG. 8 is a simplified cross section illustrating the structure of an embodiment of an IC socket for a leadless IC, and shows a state in which the socket substrate has been closed by the cover lid.

With the IC socket in FIG. 8, a concave IC guide 36 is further provided in the center of the socket substrate 35, and a leadless IC 34 is housed inside this IC guide 36. The inner side of the cover lid 37 is provided with a convex pressing member 38 and a guide component 39 that supports this cover lid 37 such that it can slide up and down.

One end of the guide component 39, which is formed as a frame, is rotatably supported such that it is concentric with the cover lid 37 by the shaft 41 of a hinge 40. A pressing component 42 that presses against the pressing member 38 is formed on the inner surface of the cover lid 37. Also, ventilation holes (not shown) that allow heat to be released are made near the center of the cover lid 37 and the pressing member 38.

Meanwhile, a probe terminal (contact terminal) 43 is positioned below the leadless IC 34 housed in the IC guide 36. This probe terminal 43 will now be described.

Figure 9:
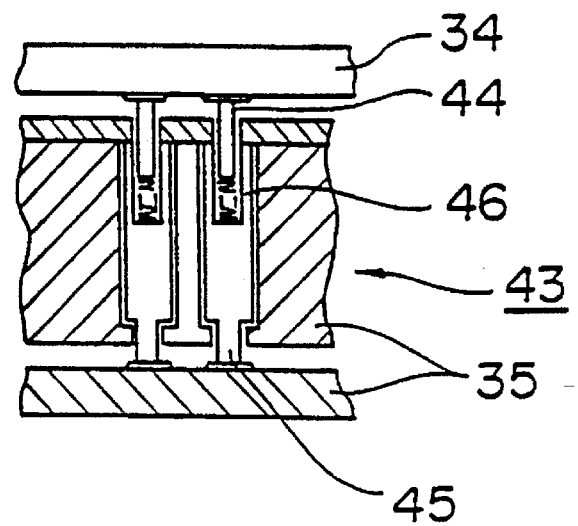
FIG. 9 is a conceptual cross-sectional view illustrating the structure of a probe terminal.
Figure 10:
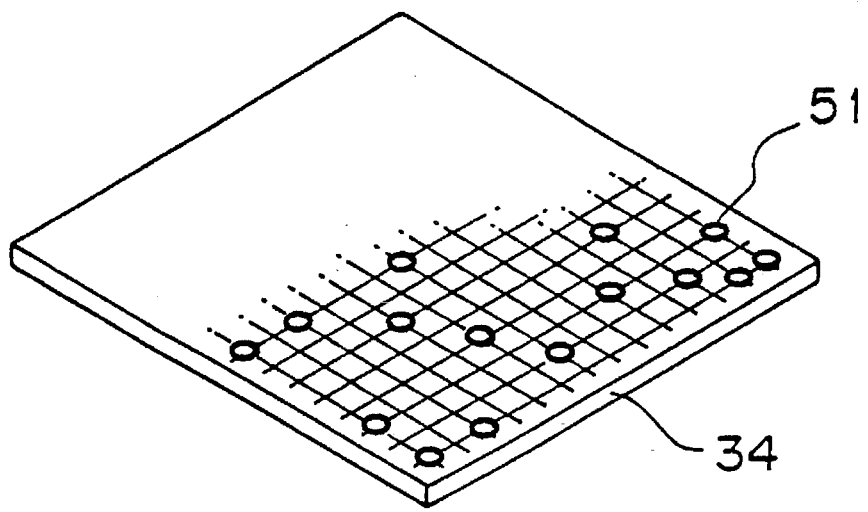
FIG. 10 shows the appearance of a leadless IC.
Figure 11:
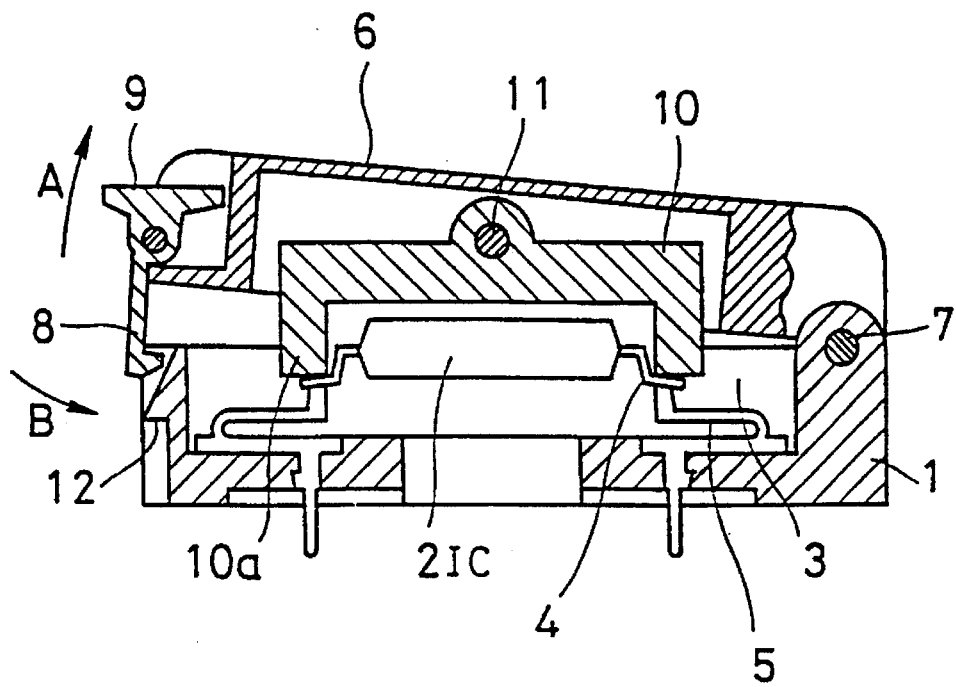
FIG. 11 is a schematic cross-sectional view illustrating a conventional IC socket.
Figure 12:
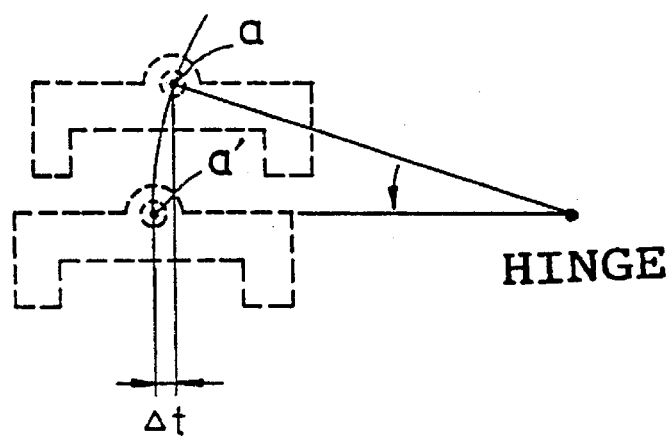
FIG. 12 is a schematic view illustrating the locus when the cover lid of the conventional IC socket is closed.

FIG. 9 is a conceptual cross section illustrating the structure of the probe terminal 43. Movable terminals 44 are located on the upper side of the probe terminal 43, and stationary terminals 45 on the lower side. The movable terminals 44 are energized to the IC side by the resilience of the springs 46 provided on the inside. A plurality of signal pads 51 are positioned at specific sites on the back surface of the leadless IC 34 on the side that comes into contact with these movable terminals 44, as shown by the diagram in FIG. 10. Circuit pads (not shown) are formed on the socket substrate 35 on the side that comes into contact with the stationary terminals 45. The probe terminal 43 is housed in a housing (not shown) of the socket substrate 35 such that the movable terminals 44 and the stationary terminals 45 will come into contact with the signals pads 51 of the leadless IC 34 and the circuit pads of the socket substrate 35, respectively.

When the leadless IC 34 is pressed downward by the pressing member 38, the terminals are pressed against their respective pads by the resilience of the springs 46 inside the probe terminal 43, and this results in conduction between the signal pads 51 and the circuit pads.

With this IC socket for a leadless IC, as the cover lid 37 is closed, the pressing member 38 is in a state in which its horizontal movement is restricted by the guide component 39, and is held in the position where the IC will be perpendicularly pressed from directly above. When the cover lid 37 has been completely closed, the pressing component 42 slides by the amount of shift over the back surface of the pressing member 38, so even if excessive force in the lateral direction, which would be a cause of lateral shifting with respect to the pressing member 38, is applied during the pressing of the IC, there is no shifting of the pressing member 38, and it is therefore possible to prevent the lateral shifting of the leadless IC 34.

Again with this IC socket for a leadless IC, it goes without saying that various embodiments are possible in terms of the positioning, shape, and structure of the pressing component just as with the IC socket for a lead-attached IC described above.

As discussed above, the IC socket according to the present invention can be applied not only to a lead-attached IC, but also to a leadless IC. Also, the structure of the pressing component that presses on the cover lid or pressing member is not limited to that discussed in the above embodiments, and as long as it functions as the force point in the pressing of the IC, it may have another shape or comprise other members.

With the IC socket according to the present invention, as described above, as the cover lid is closed over the housed IC, the pressing member is supported in a state in which it can only slide up and down at a specific location over the IC, and the pressing member is pressed perpendicularly while the pressing component slides by the amount of shift over the back surface of the pressing member, so there is no shifting of the pressing member even if excessive force in the lateral direction which would otherwise be a source of lateral shift with respect to the pressing member is applied. Therefore, the lateral shifting of the IC during IC housing is prevented, and proper conduction can be obtained between the IC electrodes and the contacts.

This invention can be implemented in a variety of other modes without deviating from the essence or primary characteristics thereof, and the above embodiments therefore are nothing more than examples, and should not be interpreted in a narrow sense. The scope of the present invention is as indicated by the Claims, and is in no way restricted by the contents of this Specification. Furthermore, any variations or permutations within the equivalent range of the Claims are also encompassed by the Claims of this invention.

What is claimed is:

1. An IC socket comprising:

a socket substrate provided with contact terminals, for housing an IC having electrodes while each of the electrodes of the IC is positioned on an associated one of the contact terminals of the socket substrate when the IC is positioned on the socket substrate, the socket substrate having a shaft;

a cover lid for covering the socket substrate, the cover lid having one end rotatably supported by the shaft of the socket substrate, and another end having a stop lever for engaging the socket substrate and a stop member;

a pressing member provided between the cover lid and the socket substrate, for pressing the IC positioned on the socket substrate down so as to ensure conduction between the contact terminals of the socket substrate and the electrodes of the IC when the socket substrate is closed with the cover lid;

a guide means for supporting the pressing member in a specific location above the IC such that it can slide up and down in a direction perpendicular to the socket substrate, the guide means having a frame structure with first and second ends and springs arranged within the first and second ends for holding the pressing member within the frame structure and biasing the pressing member toward the cover lid, the first end of the guide means rotatably supported by the shaft of the socket substrate, and the second end of the guide means engaging the stop member of the cover lid; and pressing means provided between the cover lid and the pressing member, for pressing against the pressing member when the socket substrate is closed with the cover lid.

2. An IC socket as defined in claim 1, wherein the IC is a lead-attached IC.

3. An IC socket as defined in claim 1, wherein the IC is a leadless IC.

4. An IC socket as defined in claim 1, wherein the pressing means is integrally formed with the cover lid.

5. An IC socket as defined in claim 4, wherein the pressing means comprises a hemispherical protrusion.

6. An IC socket as defined in claim 4, wherein the pressing means comprises a semi-cylindrical protrusion.

7. An IC socket as defined in claim 1, wherein the pressing means is integrally formed with the pressing member.

8. An IC socket as defined in claim 7, wherein the pressing means comprises a hemispherical protrusion.

9. An IC socket as defined in claim 7, wherein the pressing means comprises is a semi-cylindrical protrusion.

10. An IC socket as defined in claim 1, wherein the pressing means comprises a roller rotatably supported by the cover lid via a shaft.

11. An IC socket as defined in claim 1, wherein the pressing means comprises a roller rotatably supported by the pressing member via a shaft.

12. An IC socket as defined in claim 1, wherein the pressing means comprises a track ball rotatably embedded in the cover lid.

13. An IC socket comprising:

a socket substrate provided with contact terminals, for housing an IC having electrodes while each of the electrodes of the IC is positioned on an associated one of the contact terminals of the socket substrate when the IC is positioned on the socket substrate, the socket substrate having a shaft;

a cover lid for covering the socket substrate, the cover lid having one end rotatably supported by the shaft of the socket substrate and a stop member;

a pressing member provided between the cover lid and the socket substrate, for pressing the IC positioned on the socket substrate down so as to ensure conduction between the contact terminals of the socket substrate and the electrodes of the IC when the socket substrate is closed with the cover lid;

a guide means for supporting the pressing member in a specific location above the IC such that it can slide up and down, the guide means having a frame structure positioned between the cover lid and the pressing member; and pressing means provided between the cover lid and the pressing member, for pressing against the pressing member when the socket substrate is closed with the cover lid.

* * * * *